United States Patent
Jang et al.

(10) Patent No.: US 7,618,852 B2
(45) Date of Patent: Nov. 17, 2009

(54) PHASE TRANSITION METHOD OF AMORPHOUS MATERIAL USING CAP LAYER

(75) Inventors: Jin Jang, Seoul (KR); Jonghyun Choi, Seoul (KR); Do-Young Kim, Seoul (KR); Byoung-Kwon Choo, Seoul (KR)

(73) Assignee: Silicon Display Technology Co., Ltd. (KR)

( * ) Notice: Subject to any disclaimer, the term of this patent is extended or adjusted under 35 U.S.C. 154(b) by 466 days.

(21) Appl. No.: 10/533,998

(22) PCT Filed: Nov. 6, 2003

(86) PCT No.: PCT/KR03/02362

§ 371 (c)(1),
(2), (4) Date: May 4, 2005

(87) PCT Pub. No.: WO2004/042805

PCT Pub. Date: May 21, 2004

(65) Prior Publication Data

US 2006/0130939 A1   Jun. 22, 2006

(30) Foreign Application Priority Data

Nov. 8, 2002  (KR) .................. 10-2002-0068994

(51) Int. Cl.
*H01L 21/20* (2006.01)

(52) U.S. Cl. .............. 438/149; 438/166; 438/486; 438/487; 257/E21.133; 257/E21.134; 257/E21.415

(58) Field of Classification Search ......... 257/E21.497, 257/E21.133, E21.134, E21.324, E21.415, 257/E21.416; 438/149, 166, 486, 487
See application file for complete search history.

(56) References Cited

U.S. PATENT DOCUMENTS

| | | | |
|---|---|---|---|
| 6,124,155 A * | 9/2000 | Zhang et al. ............ 438/158 |
| 6,184,068 B1 * | 2/2001 | Ohtani et al. ........... 438/151 |
| 6,475,857 B1 | 11/2002 | Kim et al. |
| 6,531,348 B2 * | 3/2003 | Kim et al. ............... 438/166 |
| 2001/0053613 A1 * | 12/2001 | Uochi et al. ............ 438/761 |
| 2005/0157630 A1 * | 7/2005 | Yeh et al. ............ 369/275.2 |
| 2005/1023791 * | 10/2005 | Kikukawa et al. .... 369/275.4 |

(Continued)

FOREIGN PATENT DOCUMENTS

| KR | 1020010043641 | 1/2003 |
|---|---|---|
| KR | 1020020001091 | 7/2003 |

OTHER PUBLICATIONS

PCT/KR2003/0002362 International Preliminary Exam Report for PCT Application Filed Nov. 6, 2003.

*Primary Examiner*—Minh-Loan T Tran
(74) *Attorney, Agent, or Firm*—Daly, Crowley, Mofford & Durkee, LLP

(57) ABSTRACT

The present invention provides a phase transition method of an amorphous material, comprising steps of: depositing the amorphous material on a dielectric substrate; forming a cap layer on the amorphous material; depositing a metal on the cap layer; and crystallizing the amorphous material. According to the present invention, the surface of the amorphous material is protected by the cap layer, so that clean surface can be obtained and the roughness of the surface can be remarkably reduced during thermal process and sample handling. In addition, the cap layer is disposed between the amorphous material and the metal to diffuse the metal, so that the metal contamination due to the direct contact of the metal and the amorphous material in the conventional method can be remarkably reduced.

30 Claims, 13 Drawing Sheets

U.S. PATENT DOCUMENTS

2005/0267230 A1* 12/2005 Esaki et al. .................. 522/172
2006/0072442 A1* 4/2006 Kanatzidis ............... 369/275.1
2007/0032049 A1* 2/2007 Yamazaki et al. ........... 438/486
2007/0032054 A1* 2/2007 Ramaswamy et al. ....... 438/513

* cited by examiner

RMS : 13.3 Å
Ave : 10.5 Å

RMS : 9.20 Å
Ave : 7.22 Å

PHASE TRANSITION METHOD OF AMORPHOUS MATERIAL USING CAP LAYER

This application is a National Stage application under 35 U.S.C. § 371 of and claims the benefit of International Application No. PCT/KR03/02362, filed on Nov. 6, 2003, published in the English language on May 21, 2004 as International Publication Number WO 2004/042805 A1, which claims priority to Korean Application No. 10-2002-0068994 filed on Nov. 8, 2002, all of which are hereby incorporated by reference.

TECHNICAL FIELD

The present invention relates to a phase transition method of an amorphous material, and more specifically, to a method phase transition method of an amorphous material capable of implementing a uniform thin film without any contact of a metal and the amorphous material.

BACKGROUND ART

A thin film transistor (TFT) is a switching device in which a polysilicon thin film is used as an active layer. In general, the thin film transistor is used as an active device of an active matrix liquid crystal display apparatus, a switching device of an electro-luminescence display apparatus, and peripheral devices thereof.

The thin film transistor is typically manufactured by using a direct deposition process, a high temperature process, or a laser thermal treatment process. By using the laser thermal treatment process, a crystallization (or a phase transition) can be obtained even at a lower temperature of 400° C. or less, and high field effect mobility can be implemented. Therefore, the laser thermal treatment process has been more popular than the direct deposition process and the high temperature process. However, the laser thermal treatment process has problems that the phase transition is not uniform and the associated apparatuses of high price are required. In addition, since the productivity of the laser thermal treatment process is low, it is not suitable for manufacturing the polysilicon on a wide-area substrate.

The other method of crystallizing the amorphous material, particularly, the amorphous silicon is a solid-phase crystallization method capable of obtaining a uniform phase transition by using the associated apparatuses of low price. However, the method also has problems that the time of the crystallization is too long and the productivity is too low. In addition, since the temperature of the crystallization is high, a glass substrate can not be used.

On the other hand, a phase transition method of the amorphous material by using a metal has an advantage that the phase transition can be obtained at a low temperature in a short time in comparison with the solid-phase crystallization method. Therefore, many researches have been made on the method. The method includes a metal induced crystallization method.

In the metal-induced crystallization method, a specific kind of metal is directly contacted with at least one portion on the thin film of the amorphous material. And then, the phase transition is performed laterally from the contacted portion. Otherwise, the metal is doped into the thin film of the amorphous material to achieve the phase transition of the amorphous material. The examples are illustrated in FIGS. 1a to 1c.

Now, the conventional metal-induced crystallization method will be described in detail. Firstly, a buffer layer 20 is formed on a dielectric substrate 10. And then, an amorphous material 30 is deposited on the buffer layer 20 by a chemical vapor deposition (CVD) method. Next, an oxide film is formed as a cap layer 40 (see FIG. 1a).

After the cap layer 40 is formed, the cap layer 40 is patterned by using a photolithography, so that a metal can be in contact with at least one portion of the amorphous material 30. The metal 50 is deposited on the patterned cap layer 40 and the amorphous material 30 which is exposed by the patterning process. Next, a thermal treatment is performed to partially grow grains 32 and 34 in the amorphous material, so that phase-transitioned thin films 32 and 34 can be obtained (see FIG. 1b).

However, in the conventional method of performing the phase transition on the amorphous material, the characteristics of the corresponding device are deteriorated due to the metal contamination on the region where the amorphous material 30 is directly contacted with the metal 50. Therefore, an additional process of removing the region is necessary, so that the productivity of the devices may be drastically lowered.

In addition, in the case where source and drain regions in a transistor are patterned to form a thin film or in the other case where one of the source and drain regions in the transistor are patterned to form the thin film, there is a problem that the amorphous material can not be completely phase-transitioned and the amorphous material region 37 remains (see FIG. 1c).

Namely, although the conventional metal-induced crystallization method of the amorphous material has an advantage of reducing the temperature of the crystallization, there is the problem that the intrinsic characteristics of the thin film are deteriorated by the contamination due to the metal which is permeated into the phase-transitioned thin film.

As a result, in order to use the metal-induced crystallization method of the amorphous material, it is necessary to minimize the metal contamination of the thin film. In order to minimize the contamination of the thin film, the most important thing is to reduce the amount of the metal used therein. The approaches disclosed to solve these problems include one method where metal ions having a concentration of $10^{12}$ to $10^{14}$ cm$^{-2}$ are deposited by using an ion implantation apparatus and then a high temperature process, a rapid thermal treatment process, or a laser illumination process is performed. And, it also includes the other method where a viscous organic thin film and a liquid-phase metal are mixed in the convention metal-induced crystallization method, a deposition process is performed by a spin coating method, a thermal treatment process is performed, and then, the amorphous material is phase-transitioned.

However, the disclosed approaches have failed to effectively prevent the surface contamination of the thin film during crystallization. In addition, the approaches still have problems in terms of increasing the size of the grains and improving their uniformity

DISCLOSURE OF INVENTION

The present invention is contrived to solve the aforementioned problem, and an object of the present invention is to provide a phase transition method by which the phase transition of an amorphous material can be obtained without any direct contact of the metal and the amorphous material and a metal contamination of the thin film and the other contaminations due to a thermal treatment process can be reduced.

Another object of the present invention is to provide a phase transition method by which the thin film having grains in a uniform size can be implemented by using even an infinitesimal amount of the metal, whereby any metal etching process is not necessary and thus the productivity can be improved.

Still another object of the present invention is to provide a crystallization method by which the amount of the metal diffused into the amorphous material can be controlled by using the thickness of the cap layer and the deposition conditions of the cap layer.

In order to achieve the objects, an aspect of the present invention is a phase transition method of an amorphous material, comprising steps of: depositing the amorphous material on a dielectric substrate; forming a cap layer on the amorphous material; depositing a metal on the cap layer; and performing a phase transition on the amorphous material.

In the aspect of the present invention, it is preferable that the method further comprises a step of depositing a buffer layer before the step of depositing the amorphous material on the dielectric substrate.

In addition, in the aspect of the present invention, it is preferable that the method further comprises a step of performing a preliminary thermal treatment before the step of performing a phase transition on the amorphous material.

In addition, in the aspect of the present invention, it is preferable that the method further comprises a step of removing the metal and the cap layer after the step of performing a phase transition on the amorphous material.

Another aspect of the present invention is a phase transition method of an amorphous material, comprising steps of: depositing a metal on a dielectric substrate; forming a buffer layer on the metal; depositing the amorphous material on the buffer layer; and performing a phase transition on the amorphous material.

In addition, in the aspect of the present invention, it is preferable that the method further comprises a step of performing a preliminary thermal treatment and a step of patterning the thermally-treated film after the step of depositing the amorphous material and before the step of performing a phase transition on the amorphous material.

In addition, in the aspect of the present invention, it is preferable that the method further comprises a step of depositing a second cap layer on the metal, and a step of patterning the stack structure after the step of depositing the metal before the step of performing a phase transition on the amorphous material.

In addition, in the aspect of the present invention, it is preferable that the dielectric material is a material selected from glass, quartz, a single crystal wafer covered with an oxide film, or a thin metal substrate covered with an insulator.

In addition, in the aspect of the present invention, it is preferable that the amorphous material is an amorphous silicon.

In addition, in the aspect of the present invention, it is preferable that the cap layer is a single film comprising one selected from a silicon nitride film, a silicon oxide film, and an organic film, or a double film comprising a silicon nitride film and a silicon oxide film.

In addition, in the aspect of the present invention, it is preferable that the cap layer comprises a first part and a second part which are different from each other.

In addition, in the aspect of the present invention, it is preferable that the first part is formed to be a single film and the second part is formed to be a double film.

In addition, in the aspect of the present invention, it is preferable that the cap layer is deposited by a PECVD method.

In addition, in the aspect of the present invention, it is preferable that the thickness of the second cap layer is in a range of 0.1 to 1000 nm.

In addition, in the aspect of the present invention, it is preferable that the deposition of the metal is performed by using an ion implantation, a PECVD, a sputter, a shadow mask, or a coating of a liquid-phase metal dissolved in an acid solution, a spin coating of a mixture of an organic film and a liquid-phase metal, or a gas containing a metal.

In addition, in the aspect of the present invention, it is preferable that the metal is partially patterned by using one selected form a photolithography, a photoresist, and a shadow mask.

In addition, in the aspect of the present invention, it is preferable that the metal is deposited to have a surface density in a range of $10^{12}$ to $10^{18}$ $cm^{-2}$.

In addition, in the aspect of the present invention, it is preferable that the metal is deposited to have a thickness of 1000 nm or less.

In addition, in the aspect of the present invention, it is preferable that the metal is nickel.

In addition, in the aspect of the present invention, it is preferable that the buffer layer is a layer selected from a silicon nitride film and a silicon oxide film.

In addition, in the aspect of the present invention, it is preferable that the preliminary thermal treatment is performed at a temperature of 200 to 800° C.

In addition, in the aspect of the present invention, it is preferable that the secondary phase transition of the amorphous material is performed by at least one method selected from a thermal treatment method, a rapid thermal treatment method, and a laser illumination method.

In addition, in the aspect of the present invention, it is preferable that the thermal treatment is performed at a temperature of 400 to 1300° C.

In addition, in the aspect of the present invention, it is preferable that the thermal treatment is performed by one selected from a halogen lamp, a ultraviolet lamp, and a furnace.

BRIEF DESCRIPTION OF THE DRAWINGS

The above and other objects, advantages and features of the present invention will become apparent from the following description of preferred embodiments given in conjunction with the accompanying drawings, in which.

BEST MODE FOR CARRYING OUT THE INVENTION

Figure 1A:
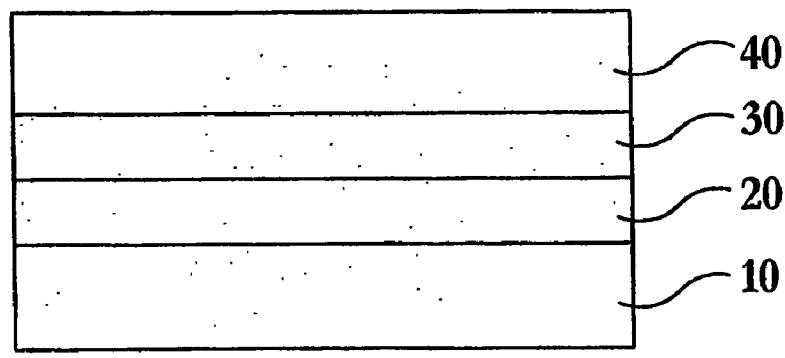
FIGS. 1a to 1c are cross-sectional views illustrating a phase transition method of a conventional amorphous material.
Figure 1B:
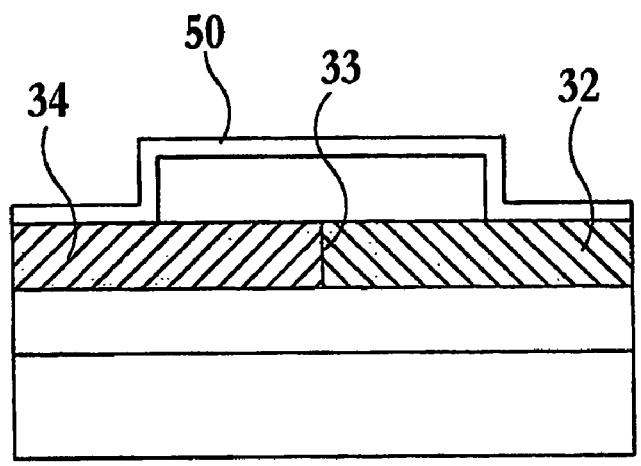
Figure 1C:
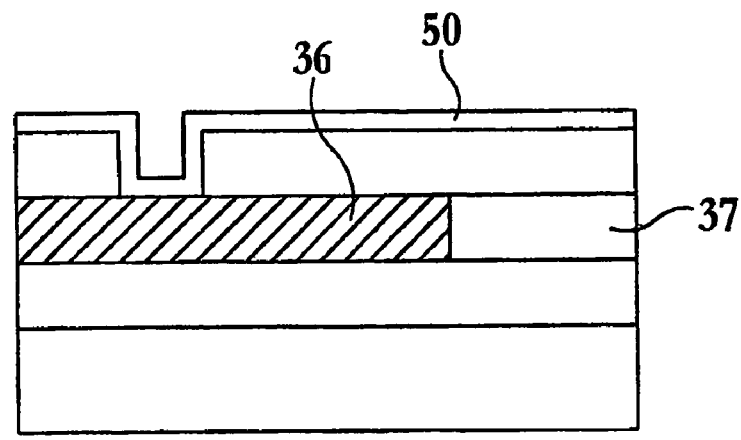
Figure 2A:
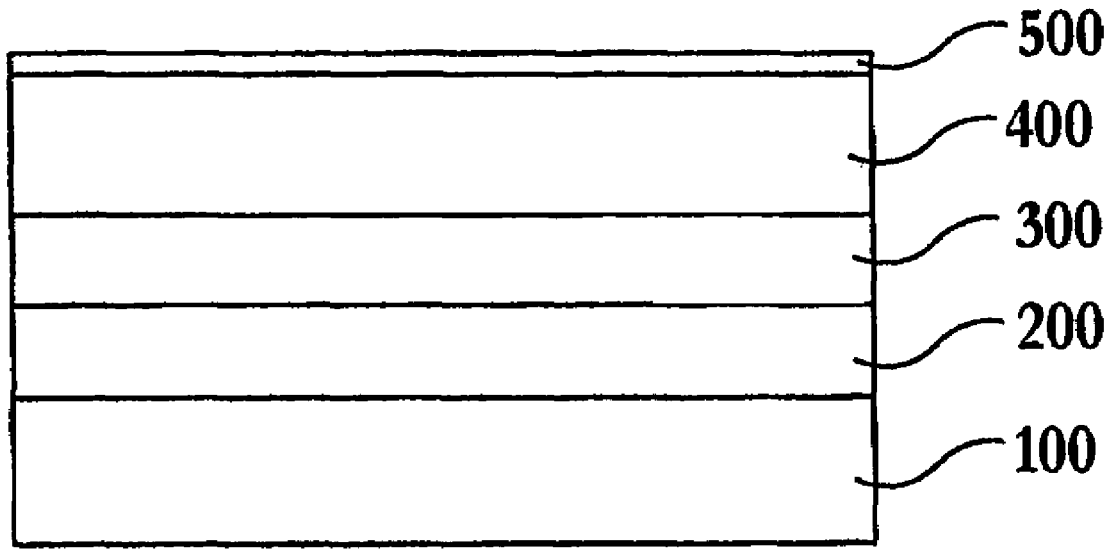
FIGS. 2a to 2d are cross-sectional views illustrating an embodiment of a phase transition method of an amorphous material according to the present invention.
Figure 2B:
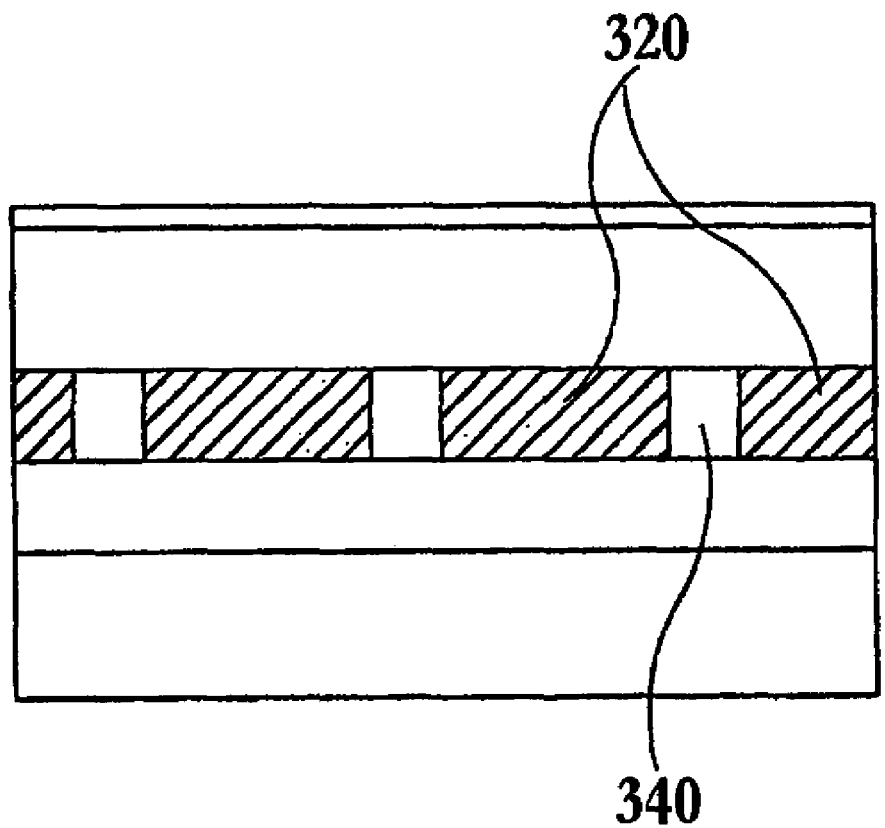
Figure 2C:
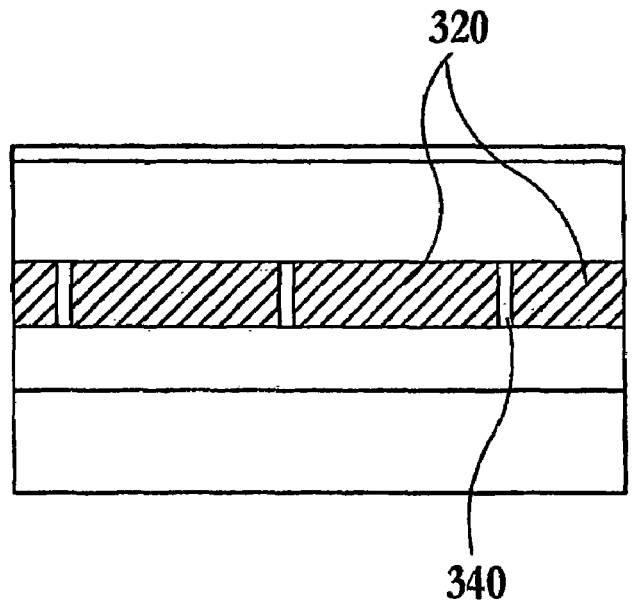
Figure 2D:
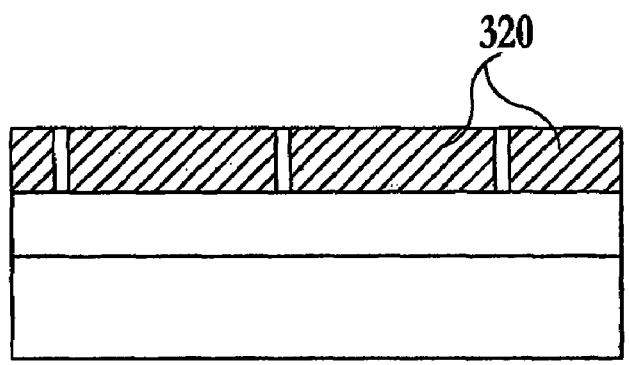

Now, the preferred embodiments according to the present invention will be described in details with reference to the accompanying drawings. The same parts are referred to as the same name although they are indicated with different reference numerals.

FIGS. 2a to 2d are schematic views illustrating a preferred embodiment of the present invention. The material that is thermally treated in the present invention comprises a dielectric substrate 100, a buffer layer 200 deposited on the dielectric substrate 100, an amorphous material 300 deposited on the buffer layer 200, a cap layer 400 formed on the amorphous material 300, and a metal 500 deposited on the cap layer 400 (see 2a).

The dielectric substrate 100 is not limited to a specific material. However, it is preferable that the dielectric material a material selected from glass, quartz, a single crystal wafer covered with an oxide film is used as the dielectric material in order to ensure the uniformity of the temperature during the phase transition of the amorphous material and the uniformity of the thin film.

The buffer layer 200 is not an essential component in the process. However, if it is deposited, the buffer layer is preferably a layer selected from a silicon nitride film and a silicon oxide film.

The amorphous material 300 is not limit to a specific material, but it may include an amorphous silicon.

The cap layer 400 has functions of diffusing the metal uniformly into the amorphous material layer and protecting the thin film from an unnecessary metal contamination. The cap layer 400 is preferably made up of one of a silicon nitride film, a silicon oxide film, an organic film, and it is also formed with a double film comprising a silicon nitride film and a silicon oxide film.

The deposition of the cap layer 400 is preferably performed at a temperature of 650° C. or less. The deposition method is not limited to a specific method, but a PECVD (plasma enhanced chemical vapor deposition) method is preferable.

In addition, the cap layer is preferably formed to have its thickness in a range of 0.1 to 1000 nm.

The deposition of the metal 500 is performed by using one method of an ion implantation method, a PECVD method, a sputter method, and a shadow mask method. Otherwise, the deposition is performed by using a coating of a liquid-phase metal dissolved in an acid solution, a spin coating of a mixture of an organic film and a liquid-phase metal, or a gas containing a metal. Therefore, the deposition method is not limited to a specific method.

In addition, the metal 500 is preferably deposited to have its surface density in a range of $10^{12}$ to $10^{18}$ cm$^{-2}$ and its thickness of 1000 nm or less. The metal used herein is not limited to a specific metal, but nickel is preferable.

The phase transition method of the amorphous material 300 is performed by one of a thermal treatment method and a method using a laser. The thermal treatment may be performed by using a halogen lamp, an ultraviolet lamp, a furnace, or the like, but it is not limited to them.

In addition, the phase transition of the amorphous material 300 is performed by a method using one of an electric field and a magnetic field.

In addition, it is preferable that the thermal treatment is performed at a temperature of 400 to 1300° C. The thermal treatment is performed by one selected from a rapid thermal treatment method in the aforementioned temperature range and a long-term thermal treatment method. Moreover, both of the methods may be used for the thermal treatment.

The rapid thermal treatment method is a method of repeating multiple times of thermal treatments for tens of seconds at a temperature of 500 to 900° C. The long-term thermal treatment method is a method of performing a thermal treatment for longer than one hour at a temperature of 400 to 500° C.

If the phase transition of the amorphous material 300 is achieved, the metal 500 is diffused into the cap layer 400. Therefore, within the amorphous material 300, nuclei of metal disilcide ($MSi_2$, precipitates) are formed to be laterally grown. As a result, grain boundaries 340 are formed between the grains 320 (see FIG. 2c).

On the other hand, the grains 320 continue to be laterally grown, so that the boundaries 340 are gradually narrowed. As a result, the amorphous material is completely phase-transitioned into a polycrystalline material (see FIG. 2c).

After the amorphous material is completely phase-transitioned, the metal 500 and the cap layer 400 are removed by an etching process. Finally, the polycrystalline film can be obtained in accordance with the present invention.

On the other hand, in order to more completely crystallizing the amorphous material, a preliminary thermal treatment may be performed at a temperature of 200 to 800° C. before the step of the phase transition of the amorphous material, or a secondary phase transition which is the same as the phase transition may be performed on the amorphous material.

The preliminary thermal treatment is performed by one of the aforementioned thermal treatment methods.

Figure 3:
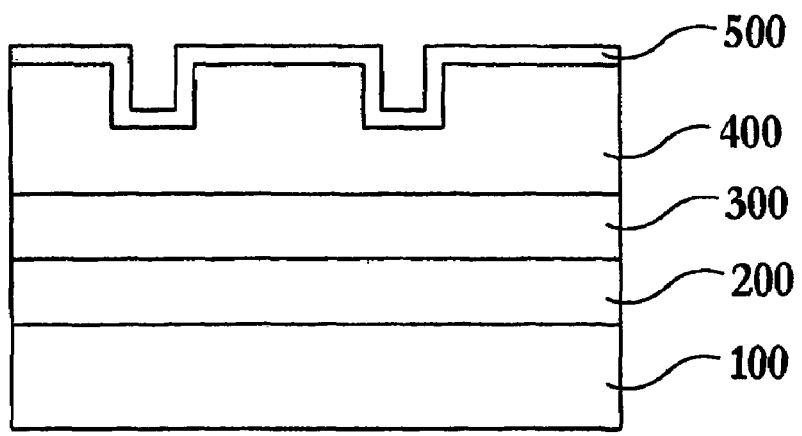
FIG. 3 is a cross-sectional view illustrating another embodiment of a phase transition method of an amorphous material according to the present invention.

FIG. 3 which is another embodiment of the present invention illustrates a phase transition method where the cap layer 400 is formed with two parts and then the phase transition of the amorphous material is performed. In the embodiment, it is sufficient for the cap layer 400 to comprise first and second parts having different thicknesses. The cap layer is not limited to a structure of the first part having a single film and the second part having a double film.

In particular, in the embodiment, it is preferable that a lower portion of the second part is made up of the same material as that of the first part. Moreover, the upper and lower portions of the second part may be made up of different materials.

Figure 4:
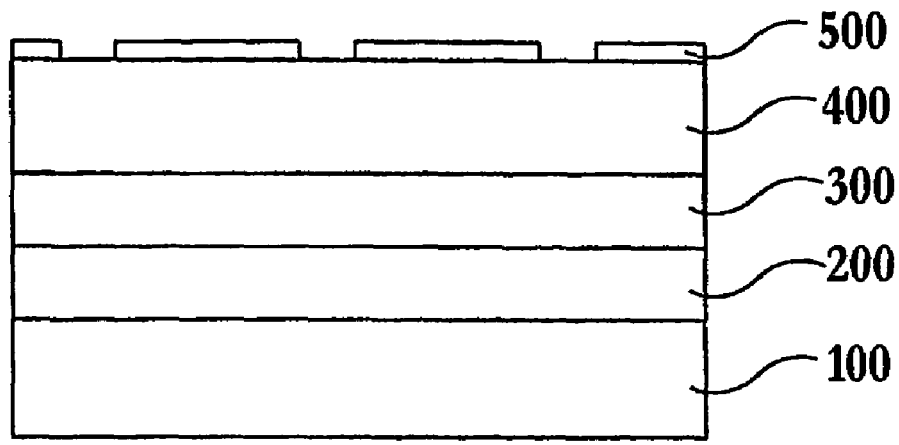
FIG. 4 is a cross-sectional view illustrating still another embodiment of a phase transition method of an amorphous material according to the present invention.

FIG. 4 which is still another embodiment of the present invention illustrates a phase transition method where the metal 500 on the cap layer 400 is partially patterned and then the phase transition of the amorphous material is performed.

In the embodiment, the partial pattering of the metal 500 is performed by using one of a photolithography, a photoresist, and a shadow mask.

Figure 5A:
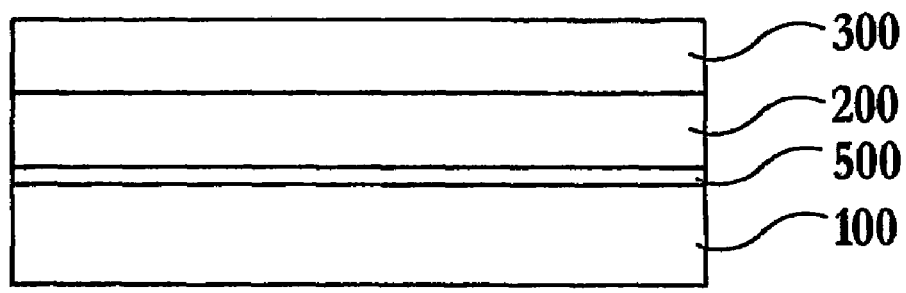
FIGS. 5a to 5c are cross-sectional views illustrating further still another embodiment of a phase transition method of an amorphous material according to the present invention.
Figure 5B:
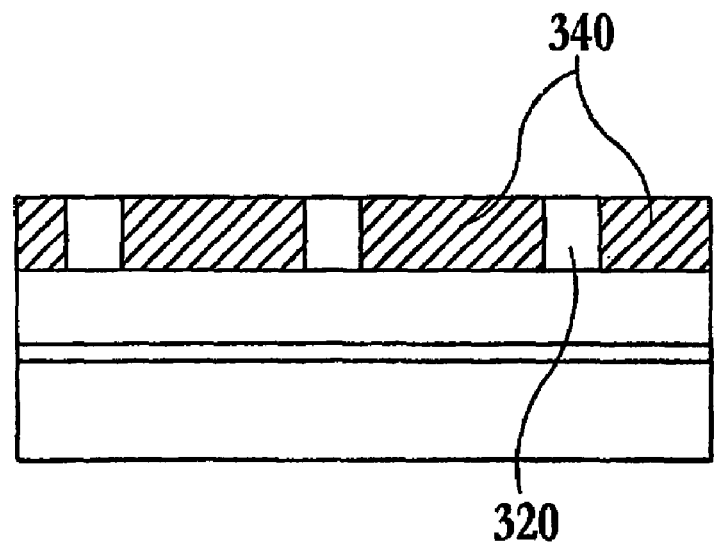
Figure 5C:
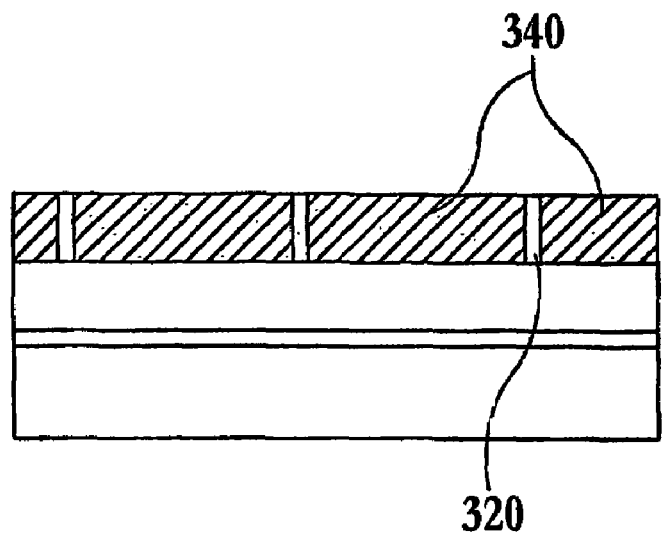
Figure 6A:
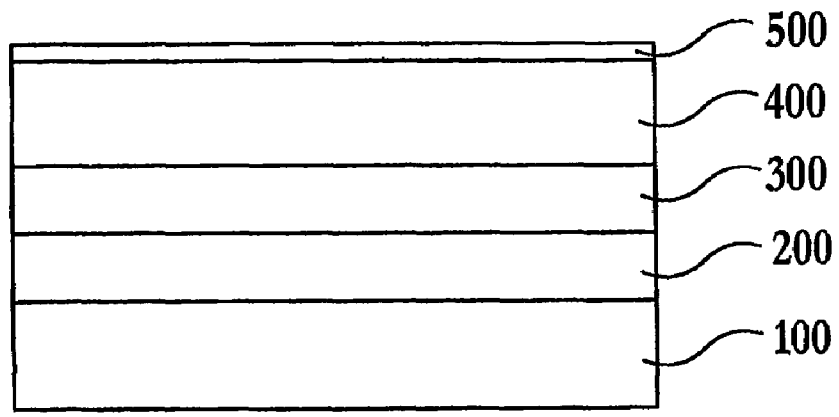
FIGS. 6a to 6d are cross-sectional views illustrating another embodiment of a phase transition method of an amorphous material according to the present invention.
Figure 6B:
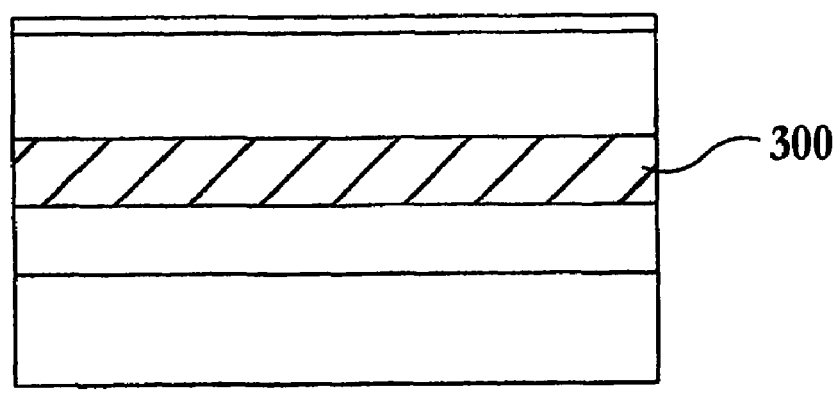
Figure 6C:
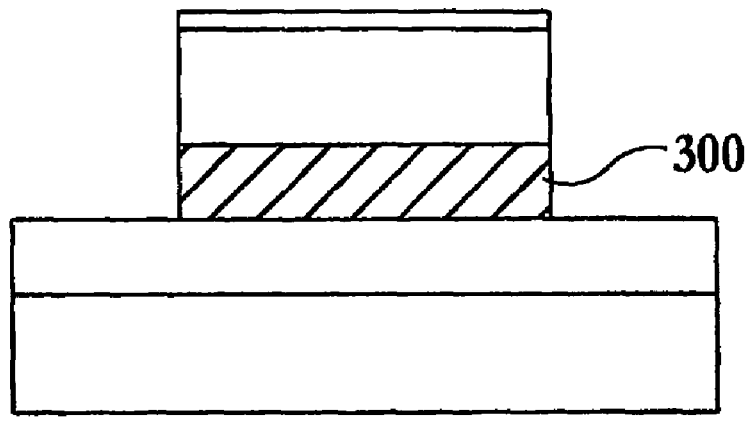
Figure 6D:
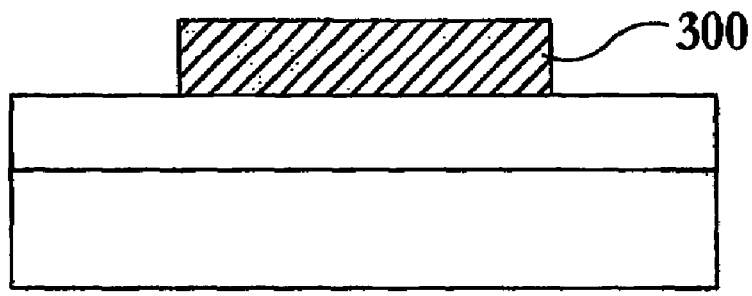

FIGS. 5a to 5c which are still another embodiment of the present invention illustrate steps in a phase transition method of an amorphous material 300 where a metal 500, a buffer layer 200, and the amorphous material 300 are sequentially deposited on a dielectric substrate 100. In the embodiment unlike the other embodiments, the metal 500 is diffused through the buffer layer 200 upwardly, and thus, the respective grains 320 within the amorphous material 300 deposited on the buffer layer 200 are grown toward the grain boundaries 340, so that the amorphous material is gradually changed into a polycrystalline material (see FIGS. 5a to 5c).

FIGS. 6a to 6d are further still another embodiment of the present invention. In the embodiment, a buffer layer 200, an amorphous material 300, a cap layer 400, and a metal 500 are sequentially deposited on a dielectric substrate 100 (see FIG. 6a). Next, a preliminary thermal treatment is performed on the amorphous material 300 (see FIG. 6b). And then, the thermally-treated metal 500, the cap layer 400, and the amorphous material 300 are patterned (see FIG. 6c). Next, the phase transition is performed on the amorphous material 300, and then, the metal 500 and the cap layer 400 are removed (see FIG. 6d). By these steps, the amorphous material is phase-transitioned.

Figure 7A:
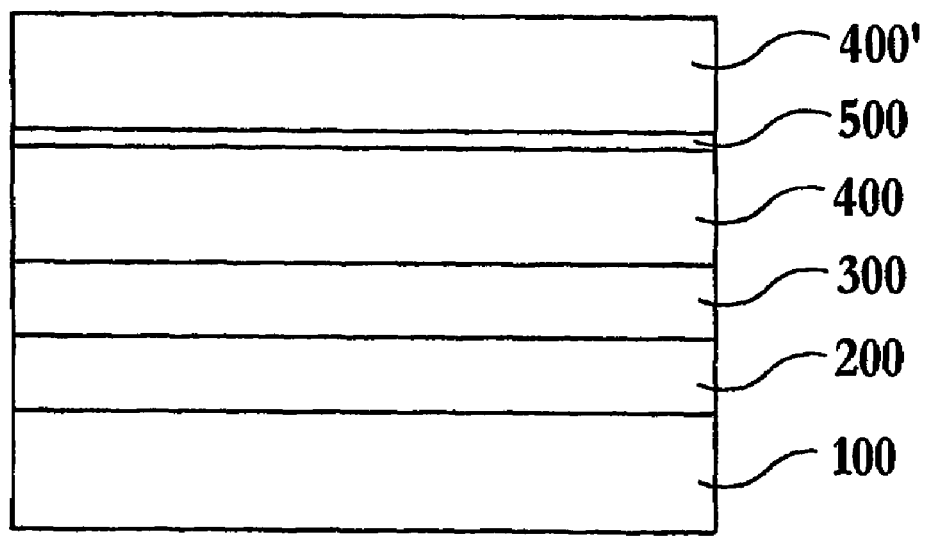
FIGS. 7a to 7c are cross-sectional views illustrating still another embodiment of a phase transition method of an amorphous material according to the present invention.
Figure 7B:
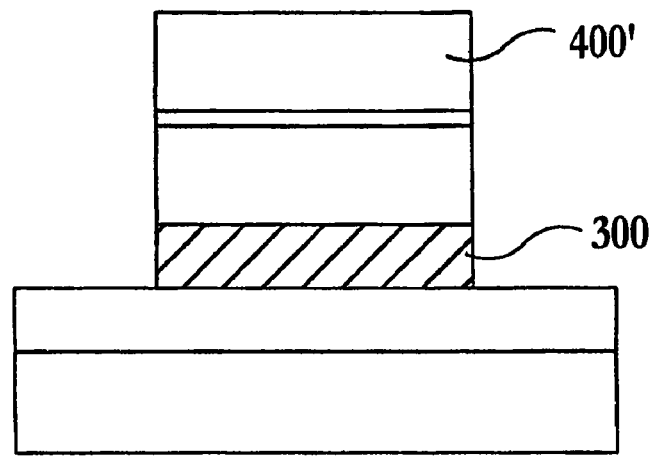
Figure 7C:
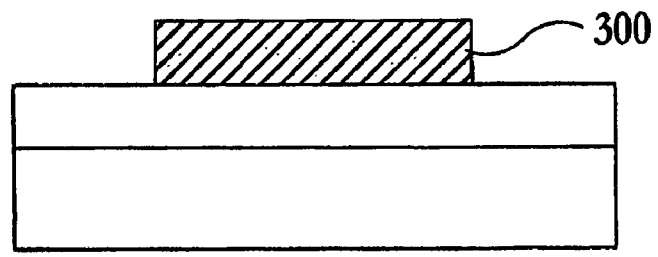

FIGS. 7a to 7c are further still another embodiment of the present invention. In the embodiment unlike the embodiment shown in FIGS. 6a to 6d, the step of depositing a second cap layer 400' on the deposited metal layer 500 is further comprised. As a result, the metal layer 500 constructed to have two cap layers above and below the metal layer.

After the completion of the deposition, before the phase transition being performed on the amorphous material, the amorphous material 300, the first cap layer 400, the metal layer 500, and the second cap layer 400' are patterned by a photolithography using a photoresist (see FIG. 7b). Next, the amorphous material 300 is crystallized, and then, the first cap layer 400, the metal 500, and the second cap layer 400' are removed (see FIG. 7c). By these steps, the amorphous material is phase-transitioned.

For the various embodiments shown in FIGS. 3 to 7, the components, the deposition methods of the components, and the phase transition method of the amorphous material shown in FIG. 2 are adapted, as they are. In addition, the secondary phase transition of the amorphous material is also adapted.

FIGS. 8 to 10 illustrate photographs of the polycrystalline silicones which are obtained by using silicon as an amorphous material in the preferred embodiments according to the present invention.

Figure 8A:
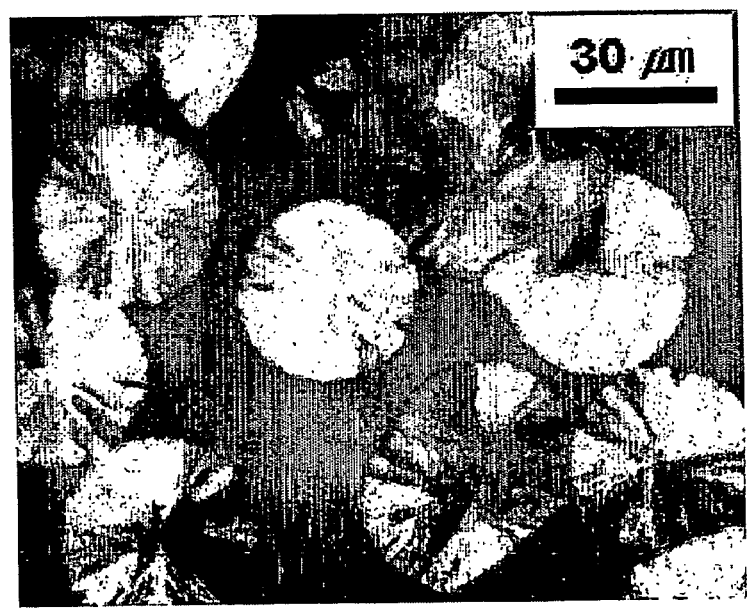
FIGS. 8a and 8b are optical microscope photographs of a polycrystalline silicon which is crystallized by a phase transition method according to the present invention.
Figure 8B:
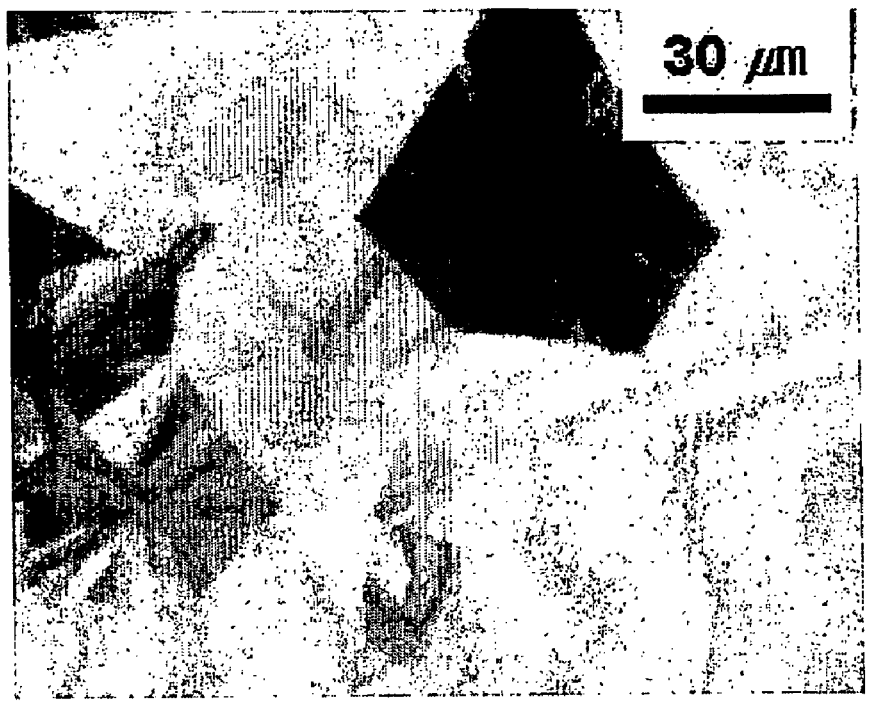

FIGS. 8a and 8b illustrate cases of phase transitions. In these cases, glass is used as the dielectric substrate and the amorphous silicon having a thickness of 50 nm is deposited on the buffer layer. In addition, the silicon nitride film having a thickness of 150 nm is deposited as the cap layer, and nickel of $10^{13}$ cm$^{-2}$ is deposited as the metal layer. Next, a thermal treatment is performed at a temperature of 430° C. for one hour. And then, multiple times of thermal treatment are performed at a temperature of 750° C. in a time interval of 20 seconds.

FIG. 8a shows a result of a phase transition by repeating 5 times of thermal treatments at a temperature of 750° C. for 20 seconds. FIG. 8b shows a result of a phase transition by repeating 20 times of thermal treatments under the same condition. In the figures, it can be understood that the grains are laterally grown. In particular, it can be understood that, as the thermal treatments are more repeated, the quality of polycrystalline is getting better and better.

Figure 9A:
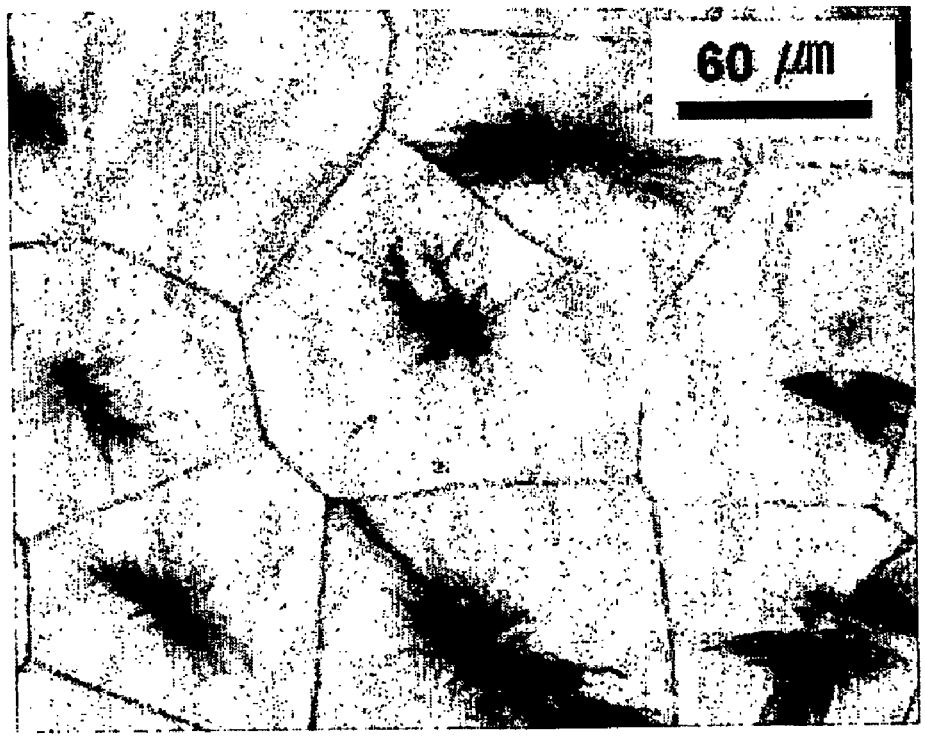
FIGS. 9a to 9c are optical microscope photographs of a polycrystalline silicon which is crystallized by a phase transition method according to the present invention and illustrate dependency on an amount of a metal.
Figure 9B:
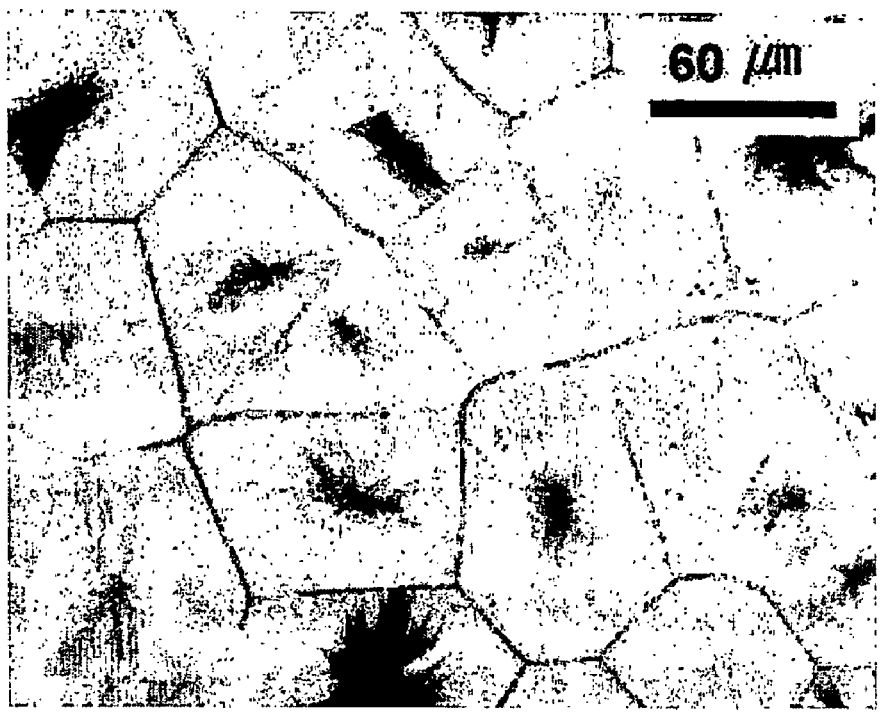
Figure 9C:
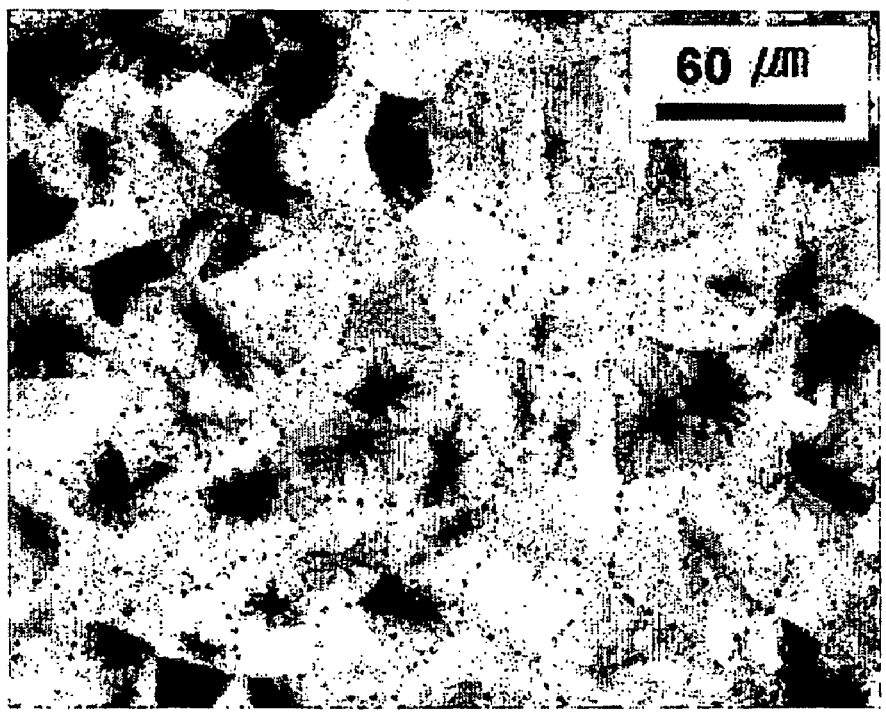

FIGS. 9a to 9c illustrate cases of phase transitions. In these cases, glass is used as the dielectric substrate, a silicon oxide film having a thickness of 100 nm is deposited as the buffer layer, and the amorphous silicon having a thickness of 50 nm is deposited. In addition, the silicon nitride film having a thickness of 60 nm is deposited as the cap layer, and nickel is deposited as the metal layer. In these cases, a preliminary thermal treatment is performed at a temperature of 500° C. for 5 minutes, as the amount of the metal is varied. And then, 20 times of thermal treatment are performed at a temperature of 750° C. for 20 seconds.

FIGS. 9a, 9b, and 9c correspond to the cases of nickel being $5 \times 10^{12}$ cm$^{-2}$, $8 \times 10^{12}$ cm$^{-2}$, and $10^{13}$ cm$^{-2}$, respectively. As shown in these figures, it can be understood that as the amount of the metal is increased, the size of the grain is getting smaller and smaller.

Figure 10A:
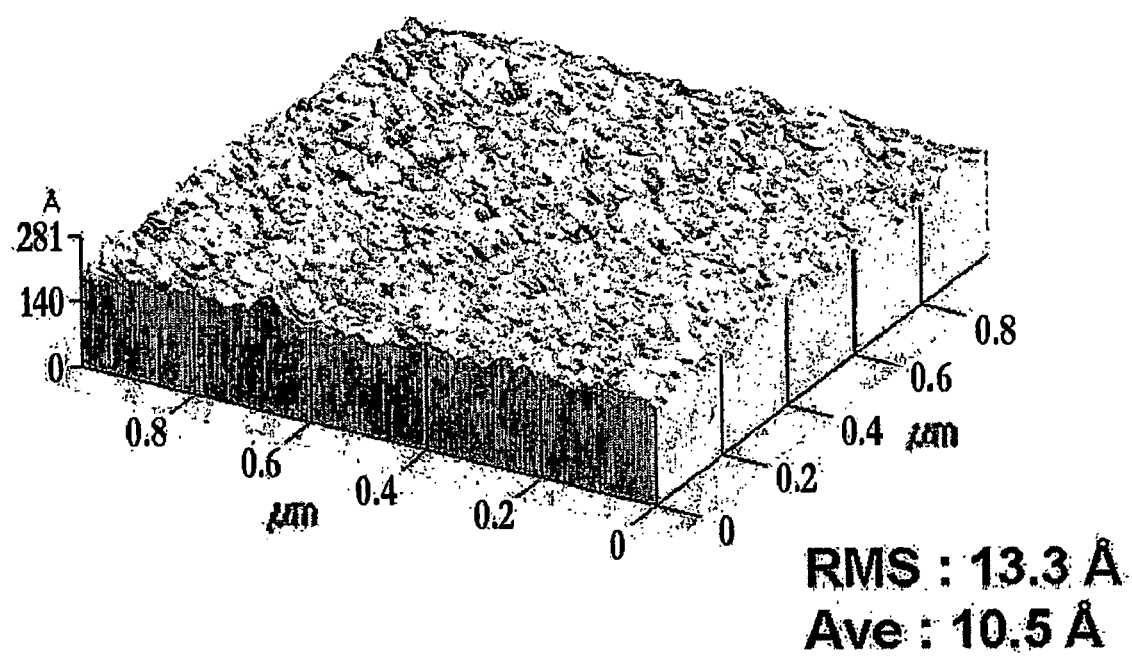
FIGS. 10a and 10b are atomic force microscope photographs of polycrystalline silicon thin films which are crystallized by the present invention and a conventional technique, respectively.
Figure 10B:
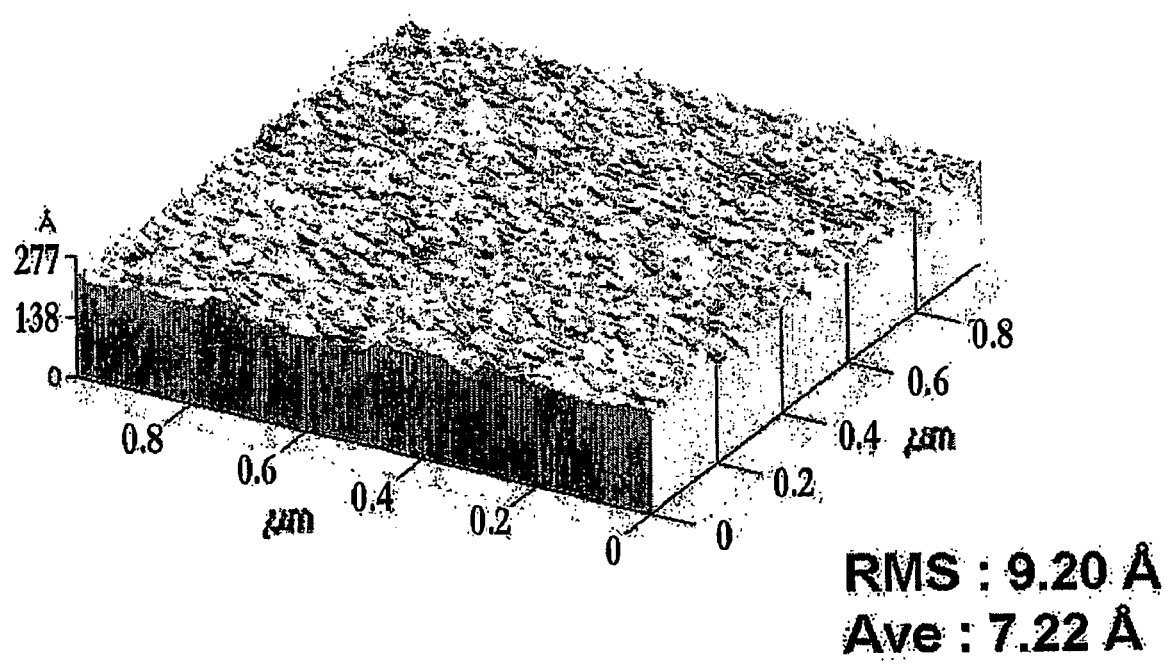

FIGS. 10a and 10b illustrate surfaces of silicon thin films as the amorphous materials which are phase-transitioned by the metal being induced according to the conventional method (FIG. 10a) and the present invention (10b), respectively. In the present invention, the cap layer having a thickness of 60 nm is formed, and then, the amorphous material is crystallized, so that the RMS roughness of the polycrystalline silicon thin film is 0.92 nm. On the other hand, the RMS (root mean square) roughness in the conventional method is 1.33 nm. As a result, it can be understood that the film of the present invention has the better roughness than that of the conventional method.

Figure 11:
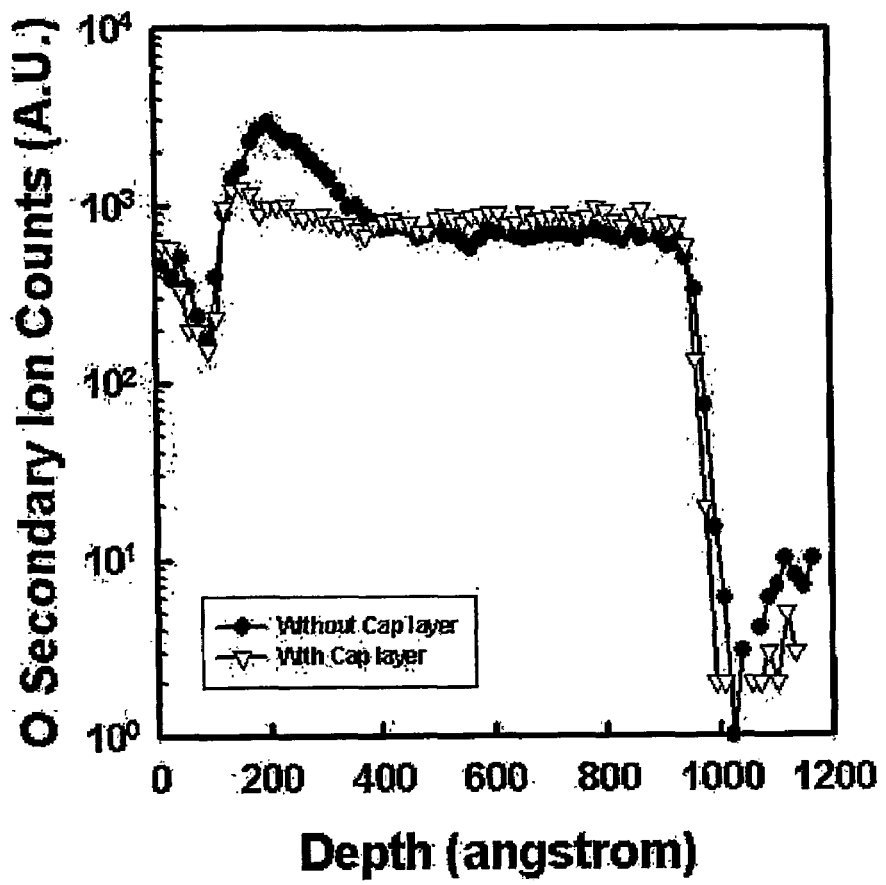
FIG. 11 is a graph illustrating a degree of an oxidation on a surface of a silicon thin film.

FIG. 11 is a graph illustrating a degree of an oxidation on a surface of a silicon thin film depending on the presence of the cap layer.

One case is that the cap layer of a nitride film is provided to have a thickness of 350 nm. The other case is that the cap layer is not provided. As shown in FIG. 11, it can be understood that the surface of the silicon thin film of the case where the cap layer is provided has less oxygen than that of the case where the cap layer is not provided, although the other process conditions are the same.

Figure 12A:
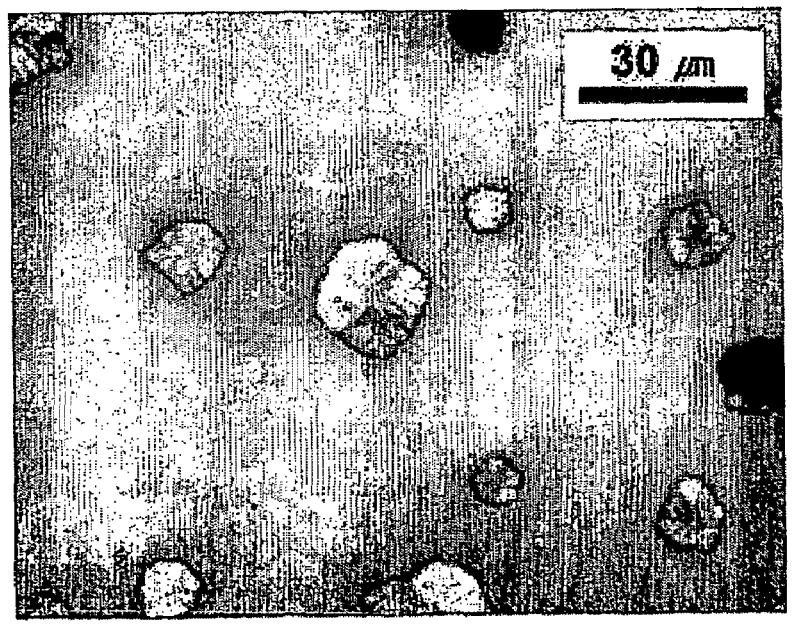
FIGS. 12a to 12c are optical microscope photographs illustrating results of phase transitions depending on ratios $[NH_3]/[SiH_4]$.
Figure 12B:
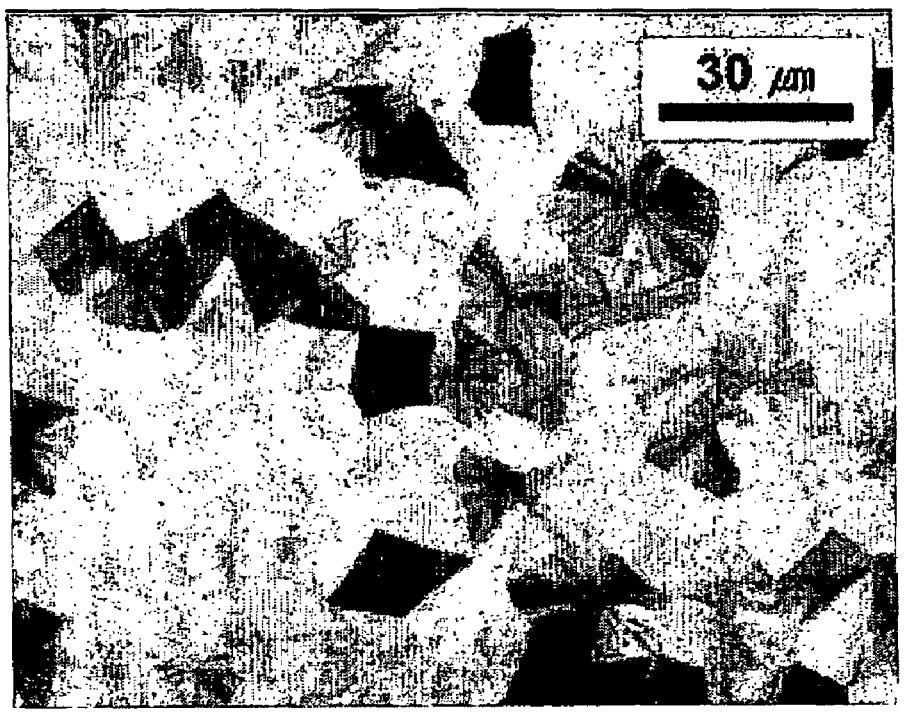
Figure 12C:
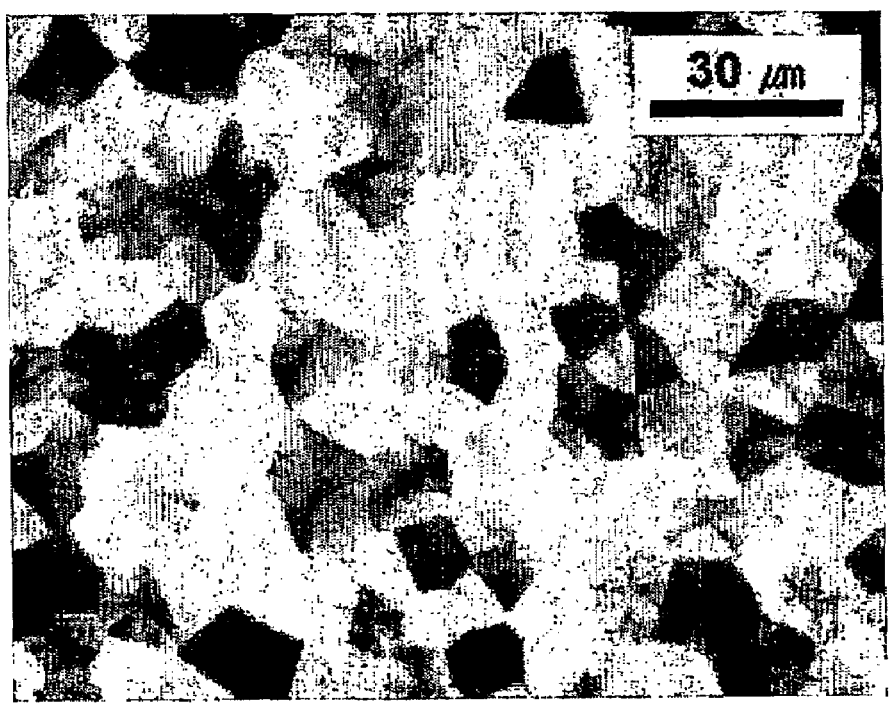
Figure 13:
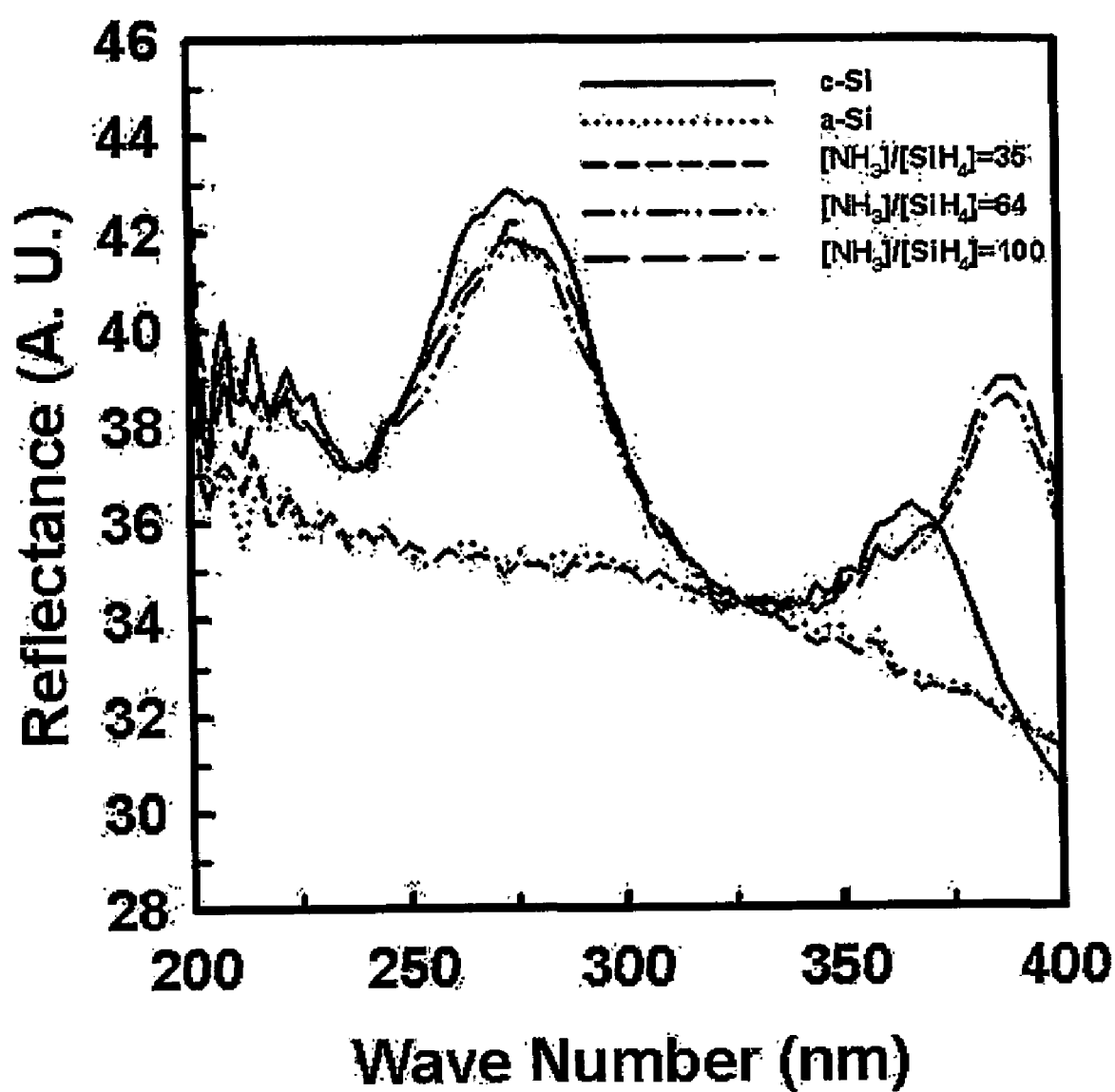
FIG. 13 is a graph of reflectance of a thin film for illustrating degrees of crystallization of the specimens of FIG. 12.

FIGS. 12 and 13 are views illustrating aspects of silicon thin film crystallization depending on the concentration of nitrogen in the nitride film used as the cap layer.

In FIG. 12, FIGS. 12a, 12b, and 12c are optical microscope photographs illustrating results of the phase transitions where the cap layer are formed to have the same thicknesses of 50 nm and ratios [NH$_3$]/[SiH$_4$] of 35, 65, and 100, respectively. Herein, in the phase transitions, the other process conditions are the same. As shown in FIG. 12, it can be understood that, in the cases of FIGS. 12b and 12c, the complete crystallization is obtained and the grains have a shape of circle or hexagon. In addition, it can be understood that the grain having a shape of hexagon is formed by the adjacent grains being abutted.

On the other hand, it can be understood that, in the case of FIG. 12a, complete crystallization is not obtained and the incomplete crystals are dispersed to have a shape of circle.

Herein, the sizes of the grains of FIG. 12b and 12a are 14 μm, and 10 μm, respectively. Therefore, the most amount of the metal, nickel can be obtained in the case that the ratio [NH$_3$]/[SiH$_4$] is 100. As a result, it can be understood that, as the ratio [NH$_3$]/[SiH$_4$] is larger, the diffusion rate of the metal is increased.

Accordingly, it can be understood that the amount of the metal can be controlled by using the ratio [NH$_3$]/[SiH$_4$].

FIG. 13 is a graph of reflectance of a thin film by using illumination of a ray of 273 nm ultraviolet light for illustrating degrees of crystallization of the specimens of FIG. 12. As shown in FIG. 13, in the case of the ratio [NH$_3$]/[SiH$_4$] being 35, the reflectance has no peak in the ultraviolet region, and in the cases of the ratios being 65 and 100, the reflectance has its peak. Therefore, it can be understood that, the metal-induced crystallization can be controlled depending on the condition of the deposition of the nitride film.

Although the present invention and its advantages have been described in details, it should be understood that the present invention is not limit to the aforementioned embodiment and the accompanying drawings and it should be understood that various changes, substitutions and alterations can be made herein by the skilled in the arts without departing from the spirit and the scope of the present invention as defined by the appended claims.

INDUSTRIAL AVAILABILITY

According to the present invention, it is advantageous that the cap layer is disposed between the amorphous material and the metal to diffuse the metal, so that the metal contamination due to the direct contact of the metal and the amorphous material, which is a problem in the conventional method, can be remarkably reduced.

In addition, according to the present invention, it is advantageous that the cap layer is formed on the amorphous material, so that the contamination or the oxidation on the surface of the thin film of the amorphous material can be prevented.

Furthermore, according to the present invention, although the cap layer is additionally provided, the cap layer can be formed without destructing the vacuum ambient in the process chamber while the conventional process of deposition of the amorphous material and the metal is performed. Therefore, it is advantageous that the process can be easily performed.

In addition, according to the present invention, it is advantageous that the amount of the metal can be controlled and the degree of the crystallization can be controlled by adjusting the concentration of nitrogen in the nitride film which is formed as the cap layer.

Moreover, according to the present invention, it is advantageous that the amount of precipitates of the metal disilicide formed in the thin film of the amorphous material can be controlled by adjusting the concentration of nitrogen in the nitride film which is formed as the cap layer, and thus, the phase-transitioned thin film having a high quality can be implemented.

What is claimed is:

1. A phase transition method of an amorphous material, comprising steps of:
   depositing the amorphous material on a dielectric substrate;
   forming a cap layer on the amorphous material;
   depositing a metal having a surface density in a range of $10^{12}$ to $10^{15}$ cm$^{-2}$ on the whole surface of the cap layer;
   depositing a second cap layer on the metal;
   patterning the stack structure after the step of depositing the metal; and
   performing a phase transition on the amorphous material after the step of patterning.

2. The phase transition method of an amorphous material according to claim 1, wherein the method further comprises a step of depositing a buffer layer before the step of depositing the amorphous material on the dielectric substrate.

3. The phase transition method of an amorphous material according to one of claim 2, wherein the buffer layer is a layer selected from a silicon nitride film and a silicon oxide film, or a double layer comprising a silicon nitride and a silicon oxide films.

4. The phase transition method of an amorphous material according to claim 1, wherein the method further comprises a step of performing preliminary thermal treatment before the step of performing a phase transition on the amorphous material.

5. The phase transition method of an amorphous material according to claim 4, wherein the method further comprises a step of patterning the thermally-treated film after the step of performing preliminary thermal treatment before the step of performing a phase transition on the amorphous material.

6. The phase transition method of an amorphous material according to claim 4, wherein the preliminary thermal treatment is performed at a temperature of 200 to 800° C.

7. The phase transition method of an amorphous material according to claim 1, wherein the method further comprises a step of removing the metal and the cap layer after the step of performing a phase transition on the amorphous material.

8. The phase transition method of an amorphous material according to one of claim 1, wherein the method further comprises a step of performing a secondary phase transition on the phase-transitioned material after the step of performing the phase transition on the amorphous material.

9. The phase transition method of an amorphous material according to claim 8, wherein the secondary phase transition of the amorphous material is performed by at least one method selected from a thermal treatment method, a rapid thermal treatment method, and a laser illumination method.

10. The phase transition method of an amorphous material according to claim 9, wherein the thermal treatment is performed at a temperature of 400 to 1300° C.

11. The phase transition method of an amorphous material according to claim 9, wherein the thermal treatment is performed by one selected from a halogen lamp, an ultraviolet lamp, and a furnace.

12. The phase transition method of an amorphous material according to claim 9, wherein an electric field or a magnet field is applied in the thermal treatment process.

13. The phase transition method of an amorphous material according to claim 1, wherein the dielectric substrate is a material selected from glass, quartz, a single crystal wafer covered with an oxide film, and a thin metal substrate covered with a dielectric film.

14. The phase transition method of an amorphous material according to one of claim 1, wherein the amorphous material is an amorphous silicon.

15. The phase transition method of an amorphous material according to claim 1, wherein the cap layer is a single film comprising one selected from a silicon nitride film, a silicon oxide film, an organic film, or a double film comprising a silicon nitride film and a silicon oxide film.

16. The phase transition method of an amorphous material according to claim 1, wherein the cap layer comprises a first part having a thin thickness and a second part having a thick thickness.

17. The phase transition method of an amorphous material according to claim 16, wherein a lower portion of the second part is made up of the same material as that of the first part.

18. The phase transition method of an amorphous material according to claim 16, wherein an upper portion of the second part is made up of the same material as or the different material from that of the first part.

19. The phase transition method of an amorphous material according to claim 1, wherein the cap layer is deposited by a PECVD method.

20. The phase transition method of an amorphous material according to claim 19, wherein the deposition is performed at a temperature of 650° C. or less.

21. The phase transition method of an amorphous material according to claim 1, wherein the thickness of the cap layer is in a range of 0.1 to 1000 nm.

22. The phase transition method of an amorphous material according to claim 1, wherein the thickness of the second cap layer is in a range of 0.1 to 1000 nm.

23. The phase transition method of an amorphous material according to one of claim 1, wherein the deposition of the metal is performed by using an ion implantation, a PECVD, a sputter, a shadow mask, or a coating of a liquid-phase metal dissolved in an acid solution, a spin coating of a mixture of an organic film and a liquid-phase metal, or a gas containing a metal.

24. The phase transition method of an amorphous material according to claim 1, wherein the metal is partially patterned by using one selected form a photolithography, a photoresist, and a shadow mask.

25. The phase transition method of an amorphous material according to one of claim 1, wherein the metal is deposited to have a thickness of 1000 nm or less.

26. The phase transition method of an amorphous material according to one of claim 1, wherein the metal is nickel.

27. The phase transition method of an amorphous material according to one of claim 1, wherein the phase transition of the amorphous material is performed by at least one method selected from a thermal treatment method, a rapid thermal treatment method, and a laser illumination method.

28. The phase transition method of an amorphous material according to claim 27, wherein the thermal treatment is performed at a temperature of 400 to 1300° C.

29. The phase transition method of an amorphous material according to claim 27, wherein the thermal treatment is performed by one selected from a halogen lamp, an ultraviolet lamp, and a furnace.

30. The phase transition method of an amorphous material according to claim 27, wherein an electric field or a magnet field is applied in the thermal treatment process.

* * * * *